United States Patent
Tseng et al.

[11] Patent Number: 6,136,644
[45] Date of Patent: Oct. 24, 2000

[54] METHOD OF MANUFACTURING A MULTI-PILLARED STORAGE NODE USING SILYLATED PHOTORESIST

[75] Inventors: Horng-Huei Tseng, Hsinchu; Huei-Wen Hsu, Taipei; Su-fen Lin, Hsin-Chu, all of Taiwan

[73] Assignee: Vanguard International Semiconductor Corporation, Hsin-Chu, Taiwan

[21] Appl. No.: 09/459,731

[22] Filed: Dec. 13, 1999

[51] Int. Cl.[7] .................................................. H01L 1/8242
[52] U.S. Cl. ..................... 438/253; 438/239; 438/254; 438/255; 438/256
[58] Field of Search ................................. 438/239, 210, 438/255, 254, 253, 256, 390, 697, 699, 717

[56] References Cited

U.S. PATENT DOCUMENTS

| | | | |
|---|---|---|---|
| 5,362,606 | 11/1994 | Hartney et al. | 430/315 |
| 5,436,187 | 7/1995 | Tanigawa | 437/52 |
| 5,438,011 | 8/1995 | Blalock et al. | 437/52 |
| 5,712,202 | 1/1998 | Liaw et al. | 438/253 |
| 5,721,154 | 2/1998 | Jeng | 437/60 |
| 5,733,808 | 3/1998 | Tseng | 438/239 |
| 5,753,419 | 5/1998 | Misium | 430/313 |
| 5,753,420 | 5/1998 | Misium | 430/313 |
| 5,792,680 | 8/1998 | Sung et al. | 438/210 |
| 5,821,139 | 10/1998 | Tseng | 438/239 |
| 5,920,763 | 7/1999 | Schuegraf | 438/3 |
| 5,922,516 | 7/1999 | Yu et al. | 430/314 |
| 5,953,608 | 9/1999 | Hirota | 438/253 |
| 6,037,218 | 9/1999 | Dennison et al. | 438/253 |

*Primary Examiner*—Matthew Smith
*Assistant Examiner*—V. Yevsikov
*Attorney, Agent, or Firm*—George O. Saile; Stephen B. Ackerman; Rosemary L. S. Pike

[57] ABSTRACT

A method for forming a dynamic random access memory cell with an increased capacitance capacitor having a multi-pillared storage node is achieved. A first layer of polysilicon fills an opening through a first dielectric layer to a node contact region. A photoresist mask is formed over the portion of a second dielectric layer over the polysilicon layer over the node contact region. The photoresist mask is silylated. The top silylated photoresist portion is removed. The second dielectric layer and the first polysilicon layer are etched away where they are not covered by the photoresist mask and the silylated photoresist sidewalls thereby forming a T-shaped first polysilicon layer. The photoresist mask is removed whereby the silylated photoresist sidewalls remain. The second dielectric layer is etched away where it is not covered by the silylated photoresist sidewalls thereby forming dielectric bars underlying the sidewalls and exposing the first polysilicon layer between the dielectric bars. The silylated photoresist sidewalls are removed. A second polysilicon layer is deposited and anisotropically etched back to leave polysilicon pillars on either side of the dielectric bars wherein the polysilicon pillars contact the T-shaped first polysilicon layer. The dielectric bars are removed whereby the T-shaped first polysilicon layer and the polysilicon pillars form a storage node of the capacitor.

30 Claims, 8 Drawing Sheets

METHOD OF MANUFACTURING A MULTI-PILLARED STORAGE NODE USING SILYLATED PHOTORESIST

RELATED PATENT APPLICATION

U.S. patent application Ser. No. 09/332,424 to Tseng, filed on Jun. 14, 1999.

BACKGROUND OF THE INVENTION (1) Field of the Invention

The present invention relates to a method of fabricating a dynamic random access memory having a multi-pillared capacitor storage node, and more particularly, a method of fabricating a dynamic random access memory having a multi-pillared capacitor storage node using silylated photoresist.

(2) Description of the Prior Art

In recent years there has been a dramatic increase in the packing density of DRAMs. Large DRAM devices are normally silicon based, and each cell typically embodies a single MOS field effect transistor with its source connected to a storage capacitor. This large integration of DRAMs has been accomplished by a reduction in individual cell size. However, the reduction in cell size results in a decrease in storage capacitance leading to reliability drawbacks, such as a lowering of source/drain ratio and undesirable signal problems. In order to achieve the desired higher level of integration, the technology must keep almost the same storage capacitance on a greatly reduced cell area.

Efforts to maintain or increase the storage capacitance in memory cells with greater packing densities have included the use of a stacked cylindrical capacitor design in which the capacitor cell uses the space over the device area for the capacitor plates. In U.S. Pat. No. 5,436,187 to Tanigawa, a cylindrical capacitor is formed using spacers. U.S. Pat. No. 5,733,808 to Tseng forms a cylindrical capacitor by laterally etching a resist mask and then etching out the central portion of a polysilicon layer. U.S. Pat. No. 5,712,202 to Liaw et al shows a process for a double-walled cylindrical capacitor using spacers and an etch back process. U.S. Pat. Nos. 5,821,139 to Tseng and 5,721,154 to Jeng show processes for forming double-walled cylindrical capacitors using spacers. U.S. Pat. No. 5,753,420 to Misium teaches a process of silylating an unexposed photoresist layer leaving a residue to be used in etching a capacitor plate with peaks. U.S. Pat. No. 5,753,419 to Misium uses silylated photoresist to etch a wave pattern into a polysilicon layer to form a storage node. U.S. Pat. No. 5,362,606 to Hartney et al discloses the use of silylated photoresist to form a pattern. Co-pending U.S. patent application Ser. No. 09/332,424 to Tseng, filed on Jun. 14, 1999, teaches a method of using silylated photoresist to form a storage node having five polysilicon bars.

SUMMARY OF THE INVENTION

Accordingly, it is a primary object of the invention to provide an improved and very manufacturable process for producing a memory cell capacitor with increased capacitance.

A further object of the invention is to provide a method for forming a capacitor having a multi-pillared storage node.

Yet another object is to provide a method for forming a capacitor having a multi-pillared storage node by using a silylated photoresist process.

According to the objects of the invention, a method is described for forming a dynamic random access memory cell with an increased capacitance capacitor having a multi-pillared storage node by using a silylated photoresist process. Semiconductor device structures are provided in and on a semiconductor substrate wherein the semiconductor device structures include a node contact region within the semiconductor substrate. A first dielectric layer is deposited overlying the semiconductor device structures and planarized. A contact opening is made through the first dielectric layer to the node contact region. A first layer of polysilicon is deposited overlying the first dielectric layer and filling the contact opening. A second dielectric layer is deposited overlying the first polysilicon layer. A photoresist mask is formed overlying the portion of the second dielectric layer over the node contact region. The photoresist mask is silylated to form a top silylated photoresist portion and silylated photoresist sidewalls on the surfaces of the photoresist mask. The top silylated photoresist portion is removed. The second dielectric layer and the first polysilicon layer are etched away where they are not covered by the photoresist mask and the silylated photoresist sidewalls thereby forming a T-shaped first polysilicon layer. The photoresist mask is removed whereby the silylated photoresist sidewalls remain. The second dielectric layer is etched away where it is not covered by the silylated photoresist sidewalls thereby forming dielectric bars underlying the silylated photoresist sidewalls and exposing the first polysilicon layer between the dielectric bars. The silylated photoresist sidewalls are removed. A second polysilicon layer is deposited overlying the first dielectric layer, dielectric bars, and T-shaped first polysilicon layer. The second polysilicon layer is anisotropically etched back to leave polysilicon pillars on either side of the dielectric bars wherein the polysilicon pillars contact the T-shaped first polysilicon layer. The dielectric bars are removed whereby the T-shaped first polysilicon layer and the polysilicon pillars form a storage node of the capacitor. A capacitor dielectric layer is deposited over the first dielectric layer and the storage node. A third polysilicon layer is deposited overlying the capacitor dielectric layer wherein the third polysilicon layer forms the top electrode of the capacitor. The third polysilicon layer and the capacitor dielectric layer are patterned to complete formation of the DRAM with capacitor.

BRIEF DESCRIPTION OF THE DRAWINGS

In the following drawings forming a material part of this description, there is shown.

DESCRIPTION OF THE PREFERRED EMBODIMENTS

Now, in keeping with the objectives of this invention, the method for forming a DRAM storage capacitor having a multi-pillared storage node by using a silylated photoresist process is described in detail. The sequence of fabrication steps for the stacked capacitor of the invention is shown in FIGS. 1 through 16. The process for forming the field oxide and the field effect transistor structure as presently practiced in manufacturing DRAM cells is described only briefly in order to better understand the current invention. It should be well understood by those skilled in the art that by including additional process steps not described in this embodiment, other types of devices can be included on the DRAM chip. For example, P wells in the P substrate and CMOS circuits can be formed therefrom. It should also be understood that the figures depict only one DRAM storage cell out of a multitude of cells that are fabricated simultaneously on the substrate. Also, the capacitor of the invention can be used in other chip types in addition to DRAM chips.

Figure 1:
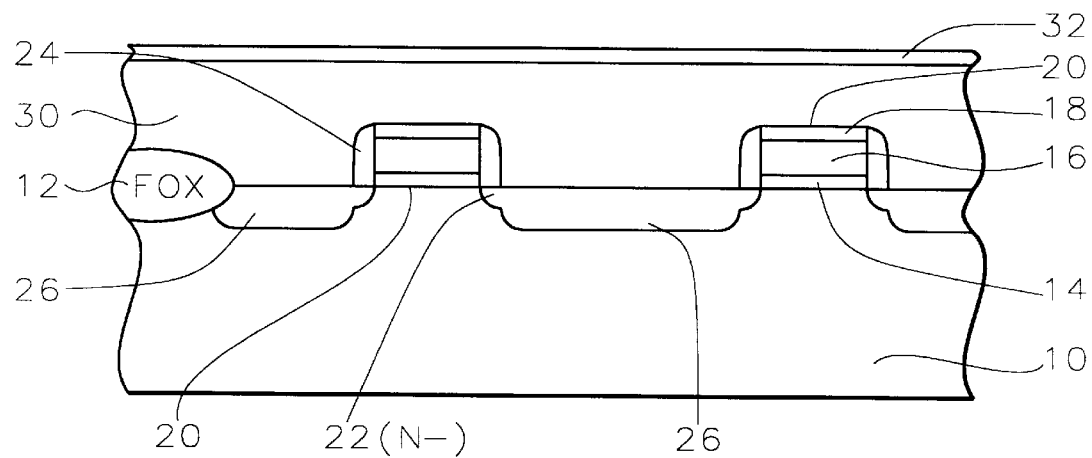
FIGS. 1 through 16 are schematic cross-sectional representations of a preferred embodiment of the present invention.

Referring now more particularly to FIG. 1, the first series of steps involves the formation of the dielectric isolation regions for isolating semiconductor surface regions from other such regions in the semiconductor substrate 10. The semiconductor substrate is preferably composed of silicon having a (100) crystallographic orientation. In an effort to simplify the description and the drawings the dielectric isolation between devices has been only partially shown and will not be described in detail, because they are conventional. For example, field oxide regions 12 are formed in and on the semiconductor substrate.

The surface of the silicon substrate 10 is thermally oxidized to form the desired gate oxide 14 thickness. The preferred thickness is between about 80 to 200 Angstroms. The polysilicon layer 16 is blanket deposited by low pressure chemical vapor deposition (LPCVD) to a preferred thickness of between about 1500 to 3500 Angstroms. A layer 18 of silicon oxide is chemically vapor deposited over the surface of the polysilicon to a thickness of between about 600 to 1200 Angstroms. The layers 14, 16, and 18 are patterned by lithography and anisotropic etching techniques as are conventional in the art to provide a desired pattern of gate electrodes and word lines 20 as seen in FIG. 1.

The source/drain structure of the MOS FET may now be formed by the following steps. FIGS. 1 through 16 illustrate the formation of an N channel FET integrated circuit device. However, it is well understood by those skilled in the art that a P channel FET integrated circuit device could also be formed by simply substituting opposite polarities to those given for the N channel embodiment. Also, a CMOS FET could in a similar way be formed by making both N channel and P channel devices upon the same substrate. As is understood in the art, the DRAM cell is composed of a combination device structure of an N channel FET and a stacked capacitor while the peripheral circuits are often composed of CMOS devices.

FIG. 1, for example shows the ion implantations of N-dopants. Lithographic masks may be required to protect the areas not to be subjected to that particular N-ion implantation. The formation of the lithographic masks is done by conventional lithography and etching techniques. The N-lightly doped drain implantation 22 is done with, for example, $P_{31}$ at a dosage of between about 1 E 13 to 1 E 14 atoms/cm$^2$ and an energy of between about 20 to 40 Kev.

The dielectric spacer 24 is now to be formed followed by the completion of the lightly doped drain source/drain structures. A tetraethyloxysilane (TEOS) LPCVD deposition is preferred to a thickness of between about 1000 to 2000 Angstroms.

An anisotropic etching of this layer produces the dielectric spacer layer 24 on the sidewalls of the layer structures 20.

The heavily doped source and drain regions 26 are formed by implantation with, for example, arsenic at a dosage of between about 1 E 15 to 1 E 16 atoms/cm$^2$ and an energy of between about 20 to 80 Kev.

A first dielectric layer 30 is formed over the field oxide and device areas. This may be a layer of silicon oxide deposited to a thickness of between about 3000 to 10,000 Angstroms. The dielectric layer is planarized, for example by chemical mechanical polishing (CMP), to obtain a flat surface. Optionally, a second dielectric layer 32 of silicon nitride may be deposited over the planarized silicon oxide layer 30 to a thickness of between about 200 and 1000 Angstroms.

Figure 2:
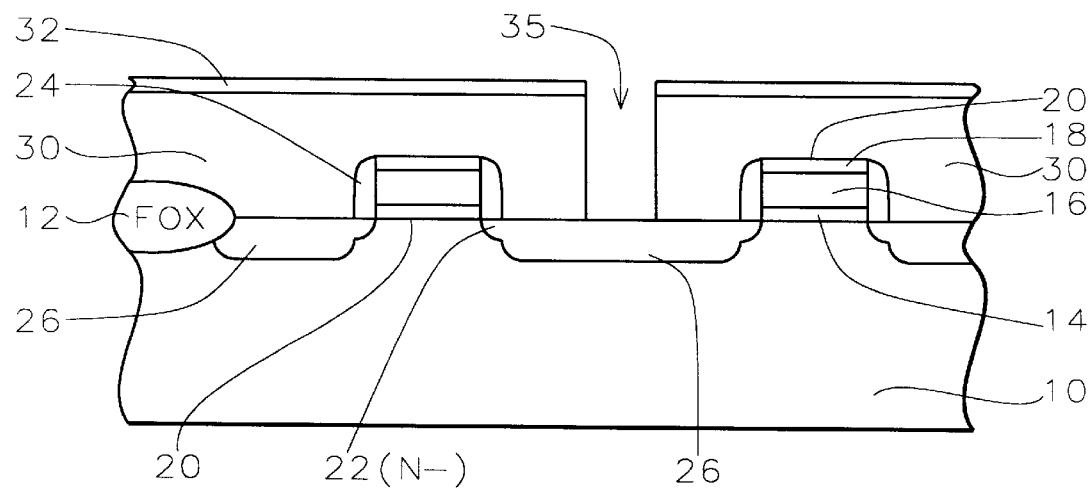

Referring now to FIG. 2, using conventional lithographic and etching techniques, a contact opening is made through the dielectric layers 32 and 30 to a conductor region in the silicon substrate, for example, source region 26. Opening 35 is made to the node contact region for the capacitor structure.

Figure 3:
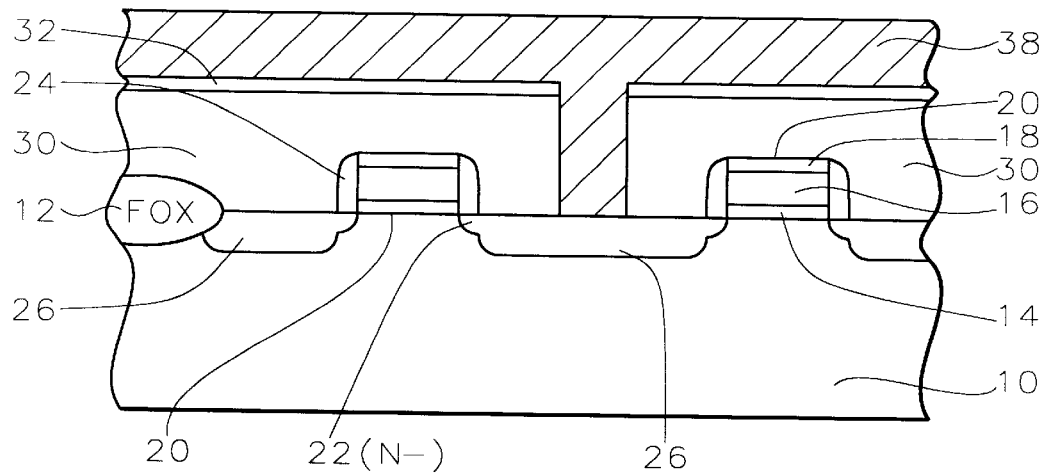
Figure 4:
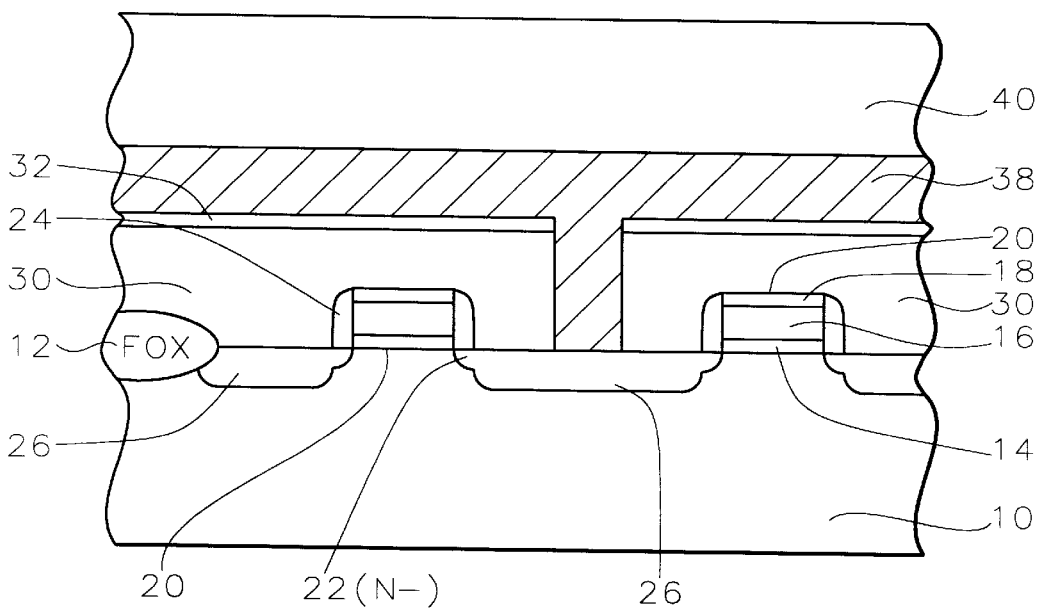

Referring now to FIG. 3, a first thin polysilicon layer 38 is deposited over dielectric layer 32 by LPCVD, preferably in situ doped. The thickness of this layer is between about 300 to 3000 Angstroms. The thin polysilicon layer 38 fills the contact hole and makes electrical contact with the node contact region 26. A second thick dielectric layer 40 is deposited over the thin polysilicon layer 38 to a thickness of between about 3000 and 12,000 Angstroms, as illustrated in FIG. 4. This dielectric layer 40 may comprise porous oxide, doped oxide, doped spin-on-glass, $O_3$-TEOS oxide, or the like. The material should be able to be etched easily and with a fast etch rate in a hydrofluoric acid (HF) solution or HF vapor.

Figure 5:
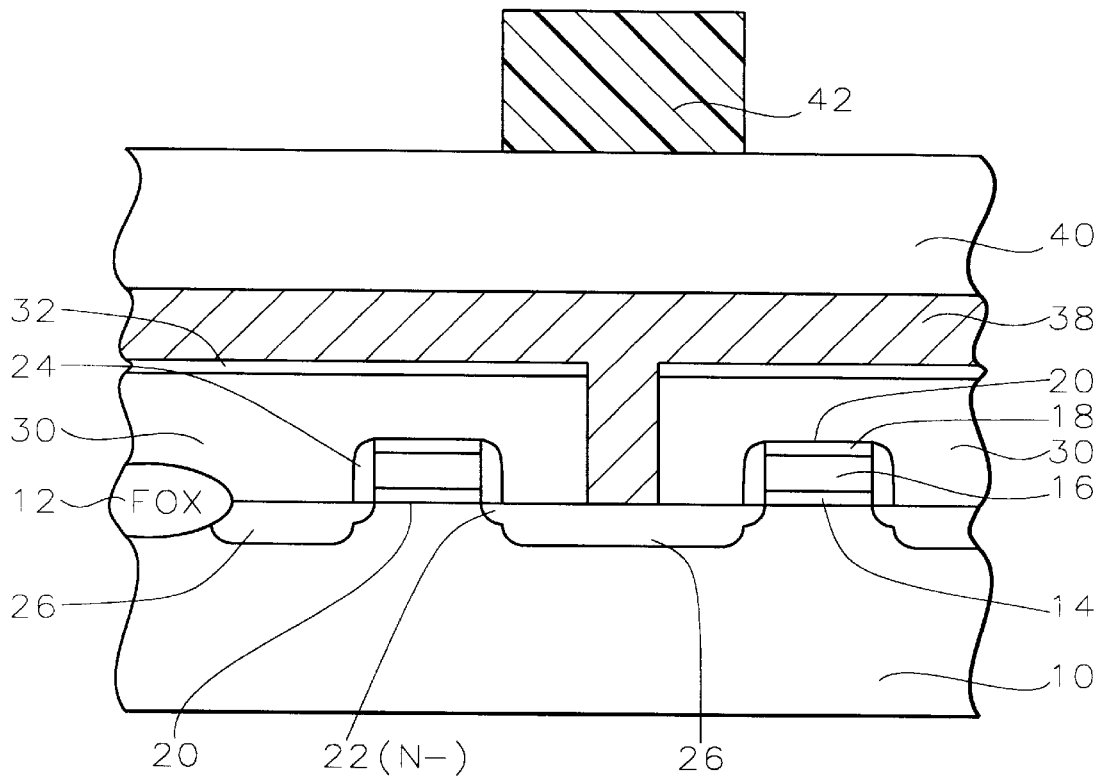

Referring now to FIG. 5, a photoresist layer is coated over the thick dielectric layer 40 to a thickness of between about 6000 and 10,000 Angstroms and patterned to form the photoresist mask 42 over a portion of the dielectric layer including that portion overlying the node contact.

Figure 6:
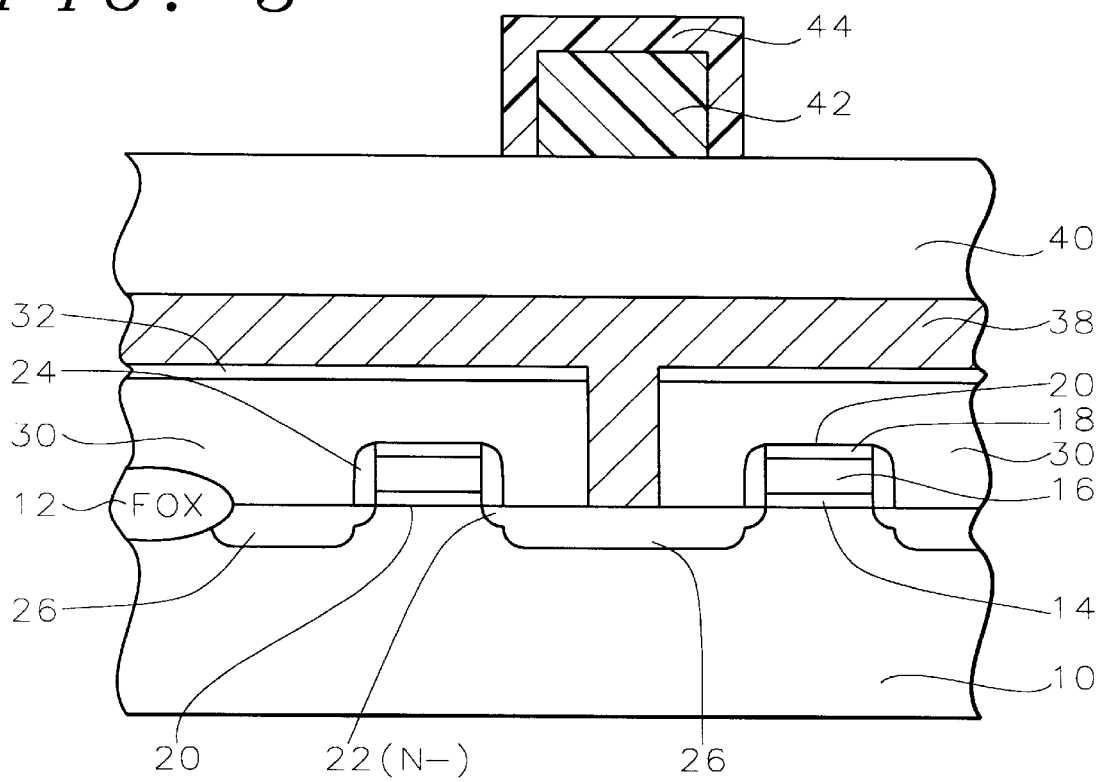

Referring now to FIG. 6, the photoresist mask 42 is silylated. Silylation is the diffusion of silicon into the photoresist material. During silylation, the photoresist is heated in an atmosphere containing a silylation agent. The photoresist is heated to a temperature of between about 50 and 70° C. for 2 to 8 minutes. Typical silylation agents include dimethylsilyldimethylamine (DMSDMA), dimethylsilyldiethylamine (DMSDEA), dimethylaminopentamethyldisilane (DMDS), and N,N-dimethylamino-1,2-dimethyldisilane (DMDS). The hydrogen radicals in the photoresist mask 42 are displaced by silicon atoms in the silylating agent to form silylated layer 44.

Figure 7:
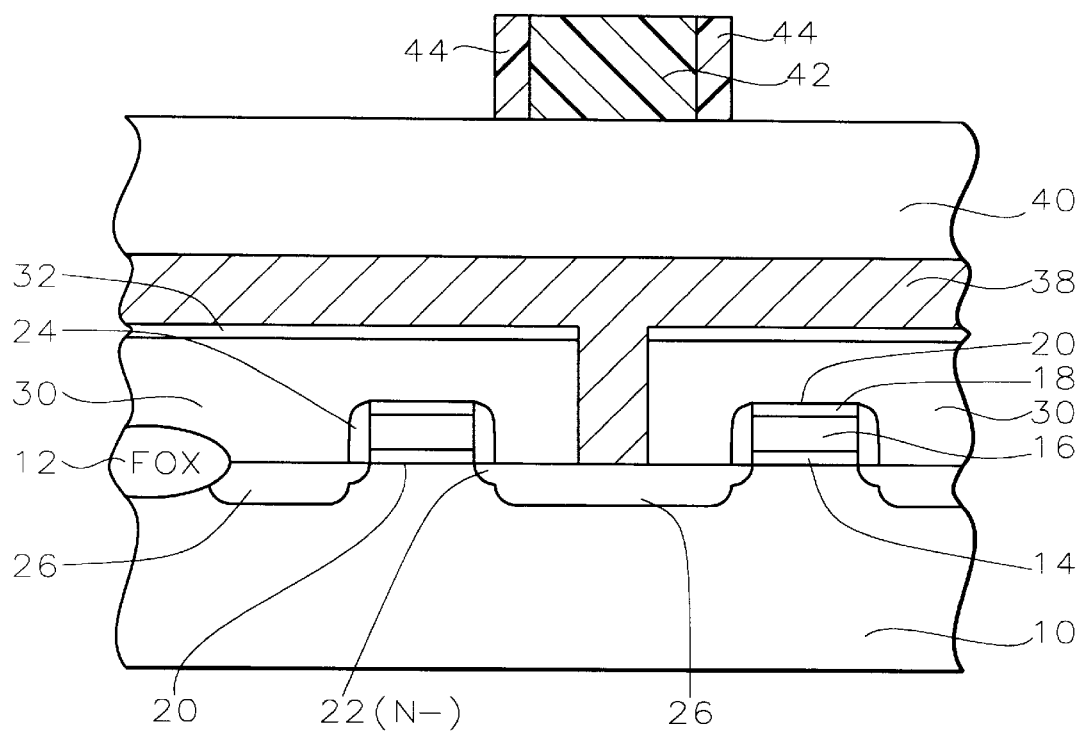

Referring now to FIG. 7, the top surface of the silylated photoresist is removed using a plasma dry etch or a sputtering process. The operative range of removal is between about 100 and 1000 Angstroms, but preferably 500 to 1000 Angstroms are removed to assure that all of the silylated photoresist 44 on the top surface of the photoresist 42 is removed. Sidewall silylated photoresist 44 remains.

Figure 8:
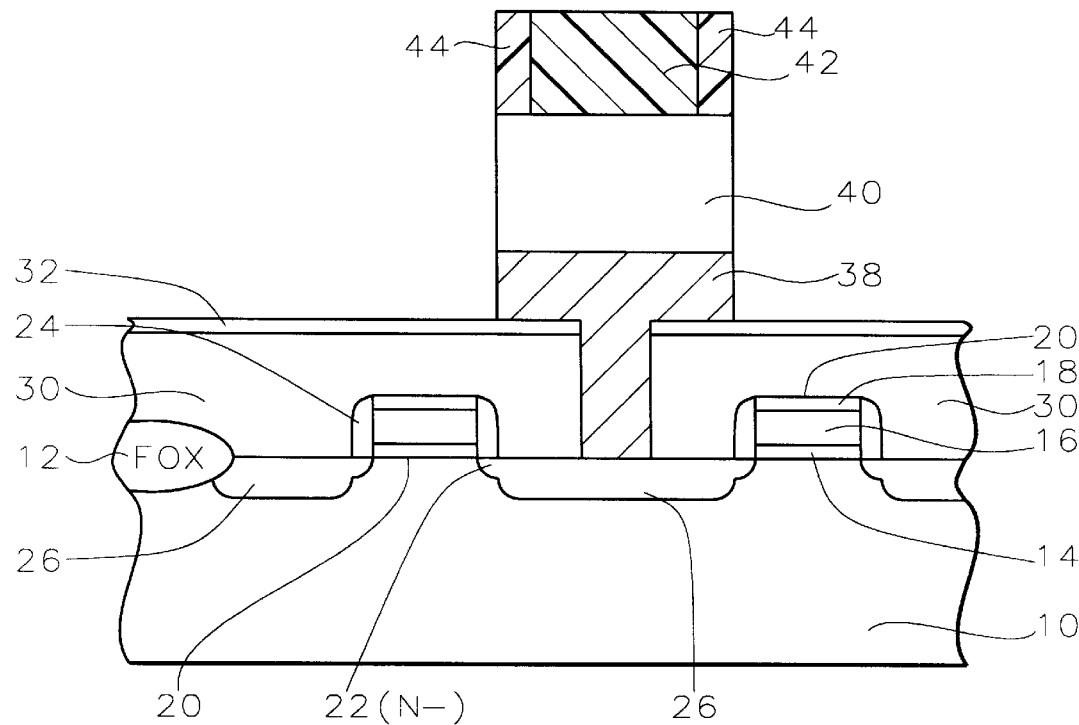

Referring now to FIG. 8, the second thick dielectric 40 and thin polysilicon layer 38 are removed using a dry plasma etching process where they are not covered by the photomask 42/44. This forms a T-shaped first polysilicon layer 38 within and overlying the node contact hole.

Figure 9:
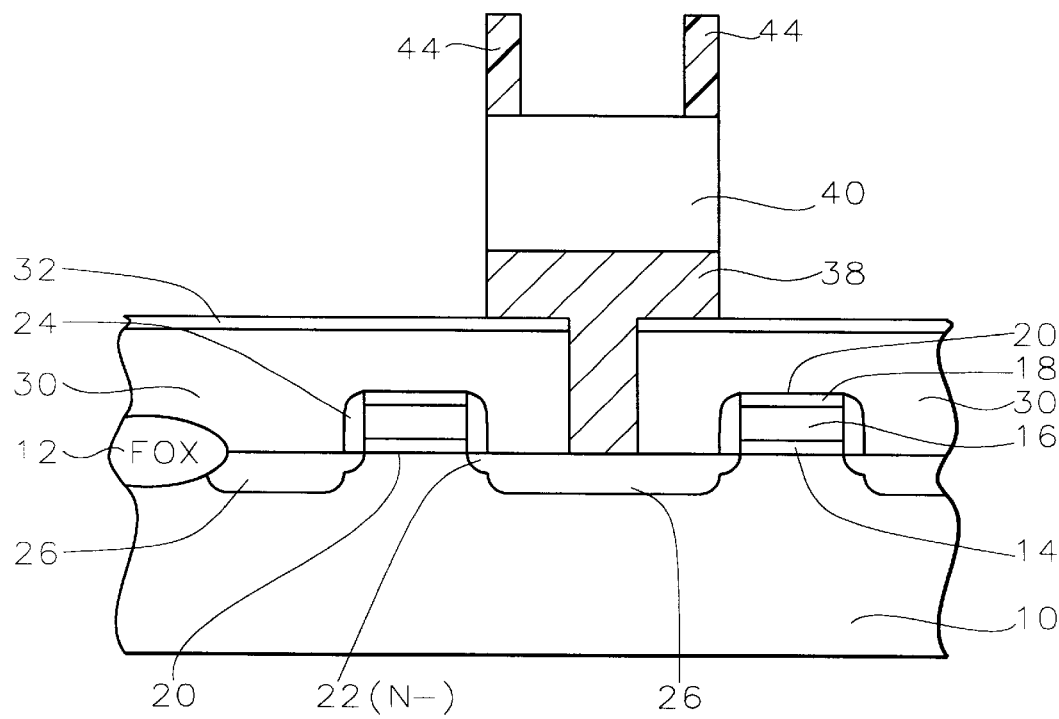
Figure 10:
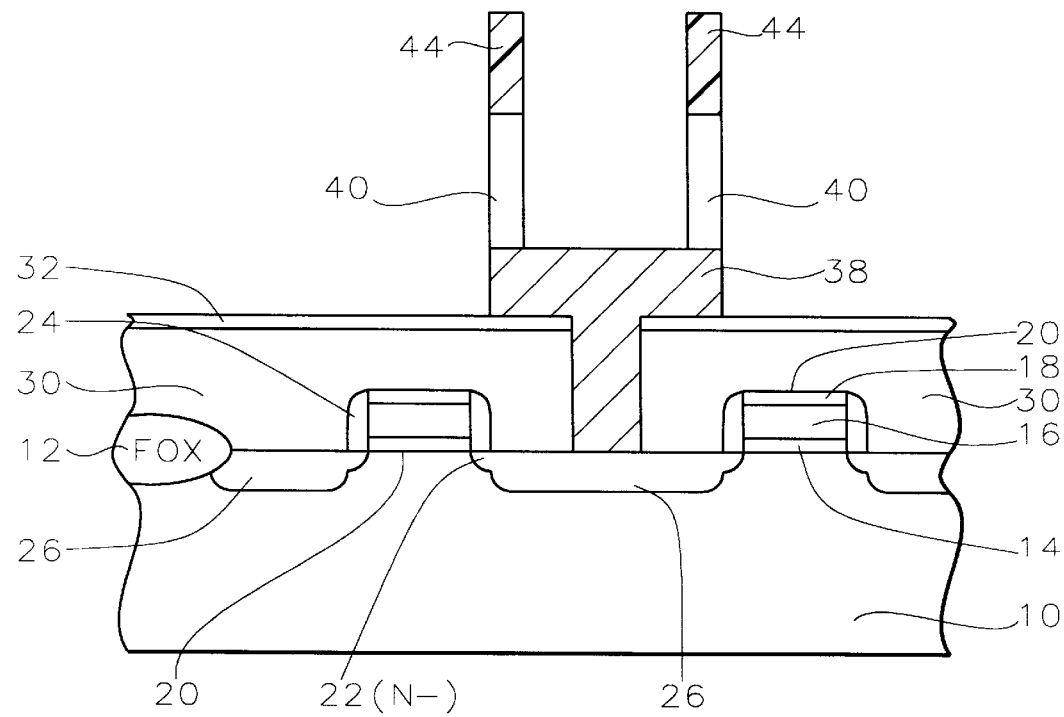

The photoresist layer 42 is removed using oxygen plasma. The silylated photoresist sidewalls 44 are not removed by this process. The resulting structure is shown in FIG. 9.

Next, the second thick dielectric layer 40 is removed where it is not covered by the silylated photoresist mask 44, using a dry plasma etch with an etch stop at the T-shaped first polysilicon layer underlying the second dielectric layer. This leaves dielectric bars 40, shown in FIG. 10.

Figure 11:
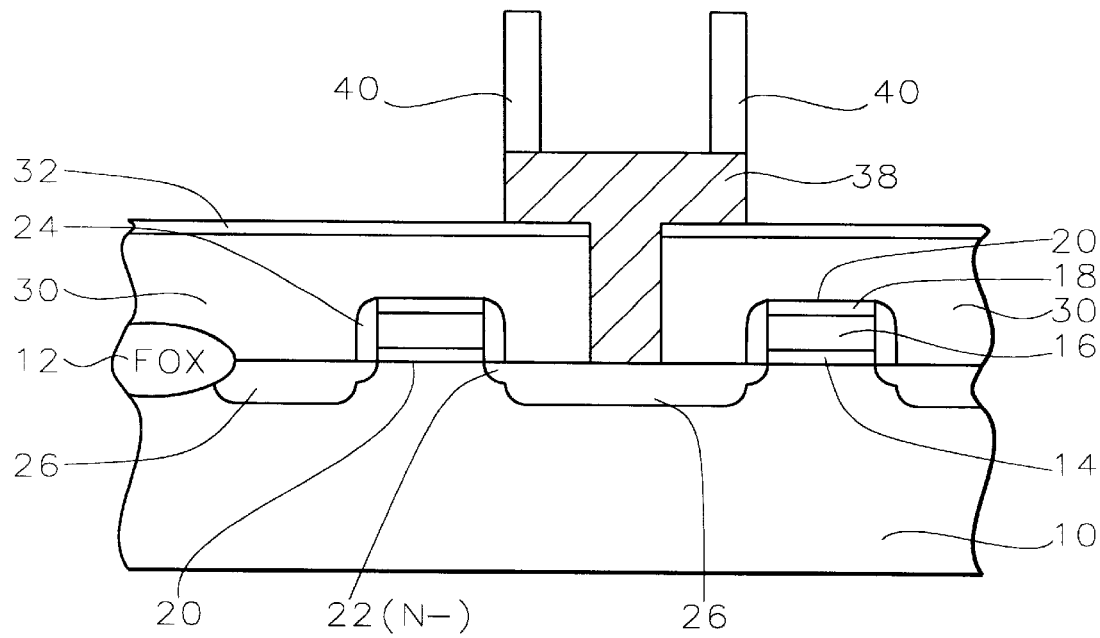

Referring now to FIG. 11, the sidewall silylated photoresist mask 44 is now removed.

Figure 12:
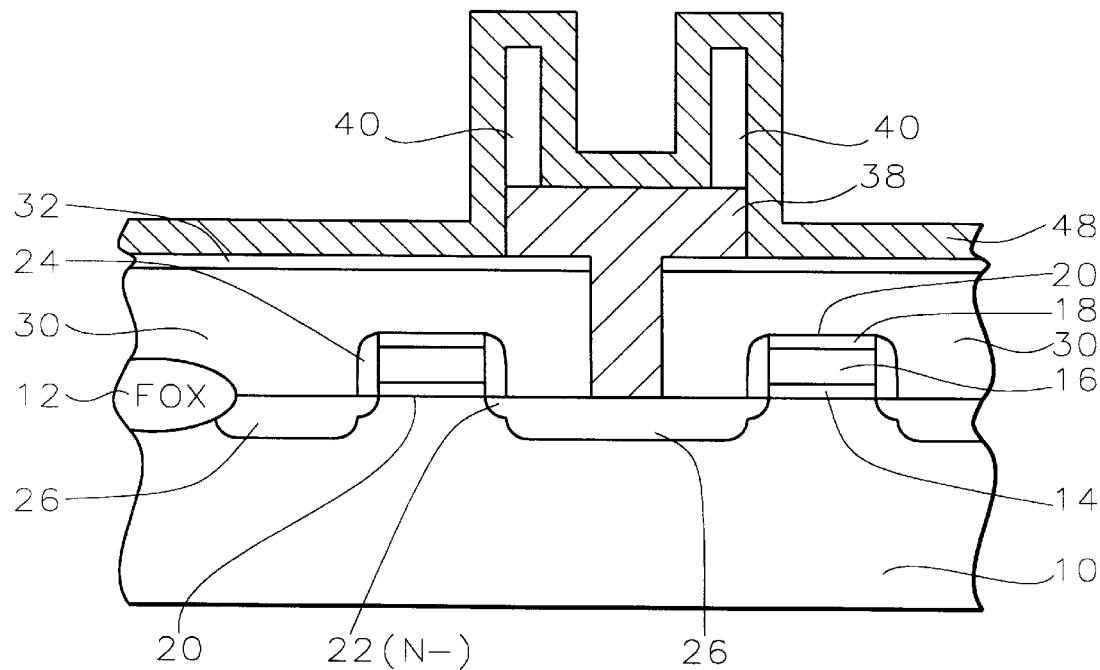

Referring to FIG. 12, a second thin polysilicon layer 48 is deposited conformally overlying the first and second dielectric layers and the T-shaped first polysilicon layer exposed between the second dielectric bars 40. The second polysilicon layer 48 is deposited to a thickness of between about 300 and 2000 Angstroms and is doped as is conventional.

Figure 13:
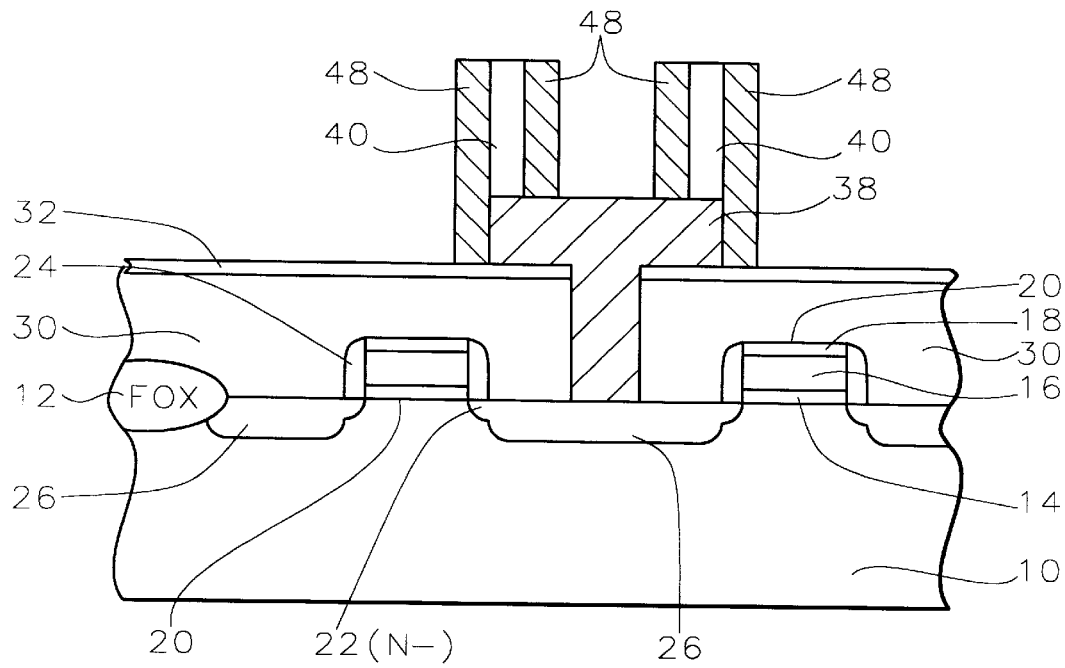

The second thin polysilicon layer is anisotropically etched back using a plasma etch to form polysilicon pillars 48 on either side of each of the dielectric bars 40, as illustrated in FIG. 13.

Figure 14:
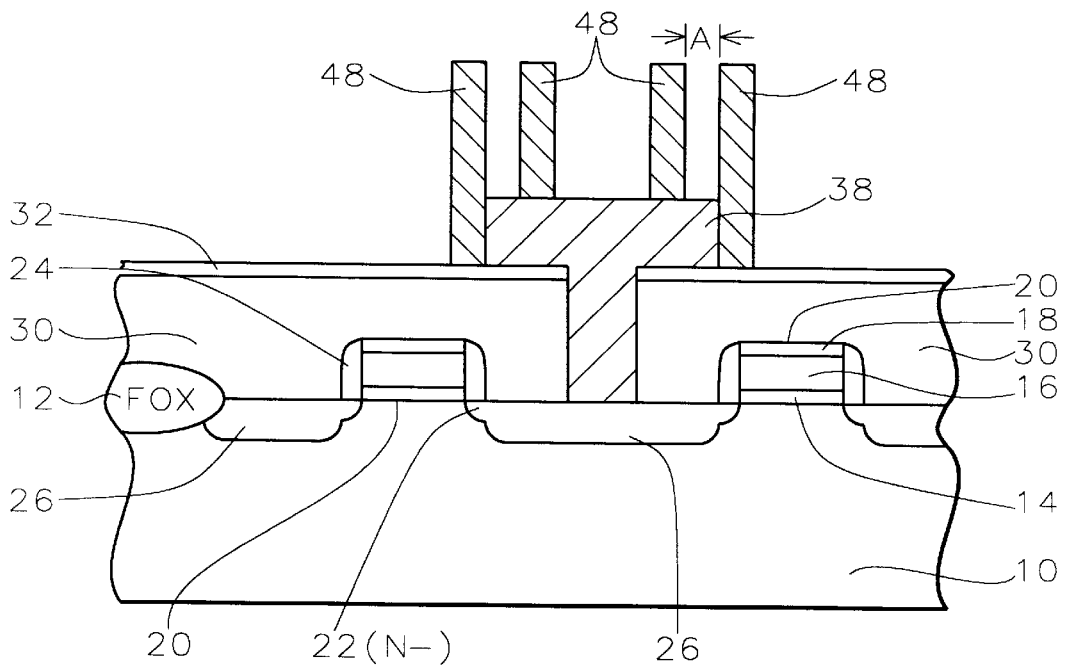

Next, as shown in FIG. 14, the dielectric bars 40 are removed, If the dielectric bars are very thin, for example about 100 Angstroms, a vapor HF process should be used to remove them. If the bars are wider, perhaps about 1000 Angstroms, a liquid HF process may be possible. This completes formation of the multi-pillared storage node. The T-shaped first polysilicon 38 and the polysilicon pillars 48 comprise the storage node of the stacked capacitor. The spacing A between the polysilicon pillars 48 is between about 300 and 1000 Angstroms and may be between about 100 and 1000 Angstroms.

Figure 15:
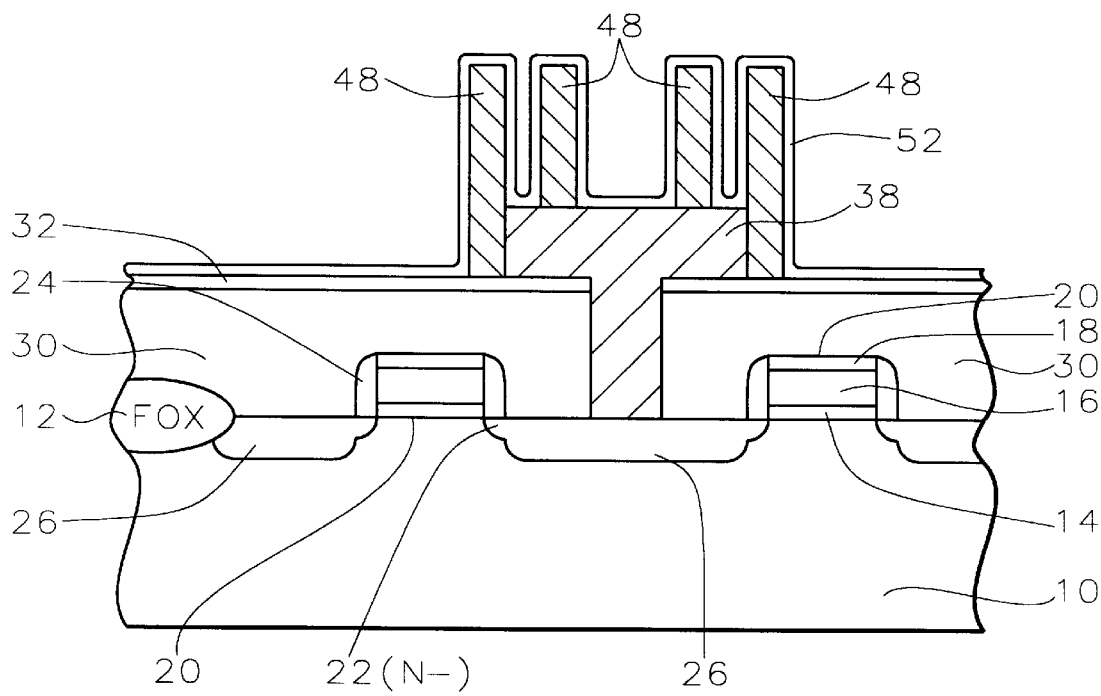
Figure 16:
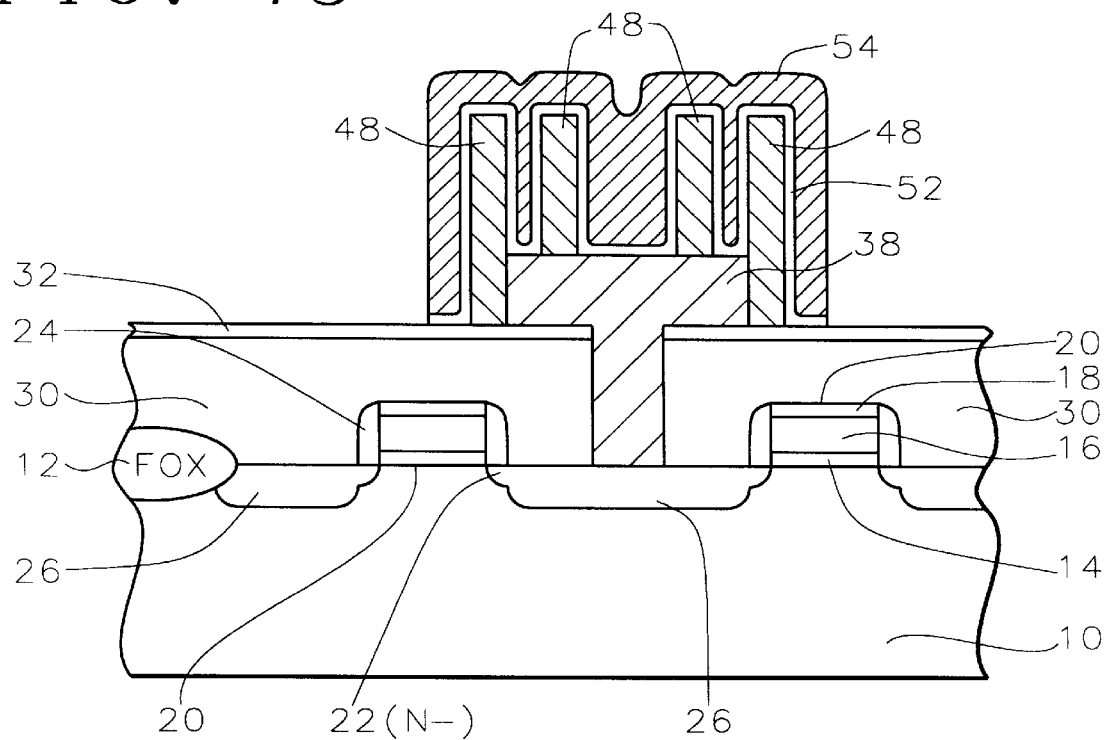

Now the capacitor structure is to be completed. Referring now to FIG. 15, the capacitor dielectric layer 52 is deposited conformally over the polysilicon 38 and 48 and insulating layer 32 surfaces. For example, a ON (oxide/nitride) dielectric may be formed by first forming a conformal oxide layer using CVD or LPCVD $O_2$, TEOS, silane, or the like. A nitride layer may be formed over the oxide layer using high temperature, low pressure $N_2$ to nitridize the oxide layer. The total ON thickness may be 50 to 100 Angstroms and may be 20 to 100 Angstroms. Other capacitor dielectrics may be used, such as ONO (oxide/nitride/oxide) or tantalum oxide, or the like.

The top plate electrode is formed by depositing a third in-situ doped polysilicon layer 54 by LPCVD. The thickness of this layer 54 is between about 300 and 3000 Angstroms. The third polysilicon layer 54 and capacitor dielectric 52 are patterned to form the top plate electrode of the capacitor.

The process of the invention results in an increased capacitance DRAM capacitor having a multi-pillared storage node.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a dynamic random access memory (DRAM) having a capacitor comprising:

providing semiconductor device structures in and on a semiconductor substrate wherein said semiconductor device structures include a node contact region within said semiconductor substrate;

depositing a first dielectric layer overlying said semiconductor device structures and planarizing said first dielectric layer;

opening a contact through said first dielectric layer to said node contact region;

depositing a first layer of polysilicon overlying said first dielectric layer and filling said contact opening;

depositing a second dielectric layer overlying said first polysilicon layer;

forming a photoresist mask overlying the portion of said second dielectric layer over said node contact region;

silylating said photoresist mask to form a top silylated photoresist portion and silylated photoresist sidewalls on the surfaces of said photoresist mask;

removing said top silylated photoresist portion;

etching away said second dielectric layer and said first polysilicon layer where they are not covered by said photoresist mask and said silylated photoresist sidewalls thereby forming a T-shaped first polysilicon layer;

removing said photoresist mask whereby said silylated photoresist sidewalls remain;

etching away said second dielectric layer where it is not covered by said silylated photoresist sidewalls thereby forming dielectric bars underlying said silylated photoresist sidewalls and exposing said first polysilicon layer between said dielectric bars;

removing said silylated photoresist sidewalls;

depositing a second polysilicon layer overlying said first dielectric layer, said dielectric bars, and said T-shaped first polysilicon layer;

anisotropically etching back said second polysilicon layer to leave polysilicon pillars on either side of said dielectric bars and wherein said polysilicon pillars contact said T-shaped first polysilicon layer;

removing said dielectric bars whereby said T-shaped first polysilicon layer and said polysilicon pillars form a storage node of said capacitor;

depositing a capacitor dielectric layer over said first dielectric layer and said storage node;

depositing a third polysilicon layer overlying said capacitor dielectric layer wherein said third polysilicon layer forms the top electrode of said capacitor; and patterning said third polysilicon layer and said capacitor dielectric layer to complete formation of said DRAM with capacitor.

2. The method according to claim 1 wherein said first dielectric layer comprises silicon oxide having a thickness of between about 3000 and 10,000 Angstroms.

3. The method according to claim 1 wherein said first dielectric layer comprises a first layer of silicon oxide having a thickness of between about 3000 and 10,000 Angstroms and a second layer of silicon nitride having a thickness of between about 200 and 1000 Angstroms.

4. The method according to claim 1 wherein said first dielectric layer is planarized by chemical mechanical polishing.

5. The method according to claim 1 wherein said first polysilicon layer has a thickness of between about 300 and 3000 Angstroms.

6. The method according to claim 1 wherein said second dielectric layer comprises oxide and has a thickness of between about 3000 and 12,000 Angstroms.

7. The method according to claim 1 wherein said second dielectric layer comprises a material that etches quickly and easily in hydrofluoric acid.

8. The method according to claim 1 wherein said photoresist mask has a thickness of between about 6000 and 10,000 Angstroms.

9. The method according to claim 1 wherein said step of silylating said photoresist mask comprises heating said photoresist mask in an atmosphere containing a silylating agent to a temperature of between about 50 and 70° C. for 2 to 8 minutes.

10. The method according to claim 1 wherein said second polysilicon layer has a thickness of between about 500 to 1500 Angstroms.

11. The method according to claim 1 wherein said step of removing said top silylated photoresist portion comprises a plasma etching to a depth of between about 100 and 1000 Angstroms.

12. The method according to claim 1 wherein said step of removing said top silylated photoresist portion comprises a sputter etching to a depth of between about 100 and 1000 Angstroms.

13. The method according to claim 1 wherein said second polysilicon layer has a thickness of between about 300 and 2000 Angstroms.

14. The method according to claim 1 wherein the width of said dielectric bars is between about 300 and 1000 Angstroms.

15. The method according to claim 1 wherein the width of said dielectric bars is between about 100 and 1000 Angstroms.

16. The method according to claim 1 wherein said capacitor dielectric layer has a thickness of between about 50 and 100 Angstroms.

17. The method according to claim 1 wherein said capacitor dielectric layer is composed of layers of silicon oxide and silicon nitride having a thickness of between about 20 and 100 Angstroms.

18. The method according to claim 1 wherein said third polysilicon layer has a thickness of between about 300 and 3000 Angstroms.

19. A method for fabricating a dynamic random access memory (DRAM) having a capacitor comprising:

providing semiconductor device structures in and on a semiconductor substrate wherein said semiconductor device structures include a node contact region within said semiconductor substrate;

depositing a first dielectric layer overlying said semiconductor device structures and planarizing said first dielectric layer;

opening a contact through said first dielectric layer to said node contact region;

depositing a first layer of polysilicon overlying said first dielectric layer and filling said contact opening;

depositing a second dielectric layer overlying said first polysilicon layer;

forming a photoresist mask overlying the portion of said second dielectric layer over said node contact region;

silylating said photoresist mask to form a top silylated photoresist portion and silylated photoresist sidewalls on the surfaces of said photoresist mask;

removing said top silylated photoresist portion;

etching away said second dielectric layer and said first polysilicon layer where they are not covered by said photoresist mask and said silylated photoresist sidewalls thereby forming a T-shaped first polysilicon layer;

removing said photoresist mask whereby said silylated photoresist sidewalls remain;

etching away said second dielectric layer where it is not covered by said silylated photoresist sidewalls thereby forming dielectric bars underlying said silylated photoresist sidewalls and exposing said first polysilicon layer between said dielectric bars;

removing said silylated photoresist sidewalls;

depositing a second polysilicon layer overlying said first dielectric layer, said dielectric bars, and said T-shaped first polysilicon layer;

anisotropically etching back said second polysilicon layer to leave polysilicon pillars on either side of said dielectric bars and wherein said polysilicon pillars contact said T-shaped first polysilicon layer;

removing said dielectric bars whereby said T-shaped first polysilicon layer and said polysilicon pillars together form a storage node of said capacitor and wherein said polysilicon pillars have a spacing of as small as 100 to 1000 Angstroms;

depositing a capacitor dielectric layer over said first dielectric layer and said storage node;

depositing a third polysilicon layer overlying said capacitor dielectric layer wherein said third polysilicon layer forms the top electrode of said capacitor; and patterning said third polysilicon layer and said capacitor dielectric layer to complete formation of said DRAM with capacitor.

20. The method according to claim 19 wherein said first dielectric layer comprises silicon oxide having a thickness of between about 3000 and 10,000 Angstroms.

21. The method according to claim 19 wherein said first dielectric layer comprises a first layer of silicon oxide having a thickness of between about 3000 and 10,000 Angstroms and a second layer of silicon nitride having a thickness of between about 200 and 1000 Angstroms.

22. The method according to claim 19 wherein said first polysilicon layer has a thickness of between about 300 and 3000 Angstroms.

23. The method according to claim 19 wherein said second dielectric layer comprises a material that etches quickly and easily in hydrofluoric acid and has a thickness of between about 3000 and 12,000 Angstroms.

24. The method according to claim 19 wherein said photoresist mask has a thickness of between about 6000 and 10,000 Angstroms.

25. The method according to claim 19 wherein said step of removing said top silylated photoresist portion comprises a plasma etching to a depth of between about 100 and 1000 Angstroms.

26. The method according to claim 19 wherein said step of removing said top silylated photoresist portion comprises a sputter etching to a depth of between about 100 and 1000 Angstroms.

27. The method according to claim 19 wherein said capacitor dielectric layer comprises one of the group containing ONO (silicon oxide, silicon nitride, silicon oxide), ON (silicon oxide, silicon nitride), and tantalum oxide.

28. A method for fabricating a dynamic random access memory (DRAM) having a capacitor comprising:

providing semiconductor device structures in and on a semiconductor substrate wherein said semiconductor device structures include a node contact region within said semiconductor substrate;

depositing a first dielectric layer overlying said semiconductor device structures and planarizing said first dielectric layer;

opening a contact through said first dielectric layer to said node contact region;

depositing a first layer of polysilicon overlying said first dielectric layer and filling said contact opening;

depositing a second dielectric layer overlying said first polysilicon layer;

forming a photoresist mask overlying the portion of said second dielectric layer over said node contact region;

silylating said photoresist mask to form a top silylated photoresist portion and silylated photoresist sidewalls on the surfaces of said photoresist mask;

removing said top silylated photoresist portion to a depth of between about 500 and 1000 Angstroms;

etching away said second dielectric layer and said first polysilicon layer where they are not covered by said photoresist mask and said silylated photoresist sidewalls thereby forming a T-shaped first polysilicon layer;

removing said photoresist mask whereby said silylated photoresist sidewalls remain;

etching away said second dielectric layer where it is not covered by said silylated photoresist sidewalls thereby forming dielectric bars underlying said silylated photoresist sidewalls and exposing said first polysilicon layer between said dielectric bars;

removing said silylated photoresist sidewalls;

depositing a second polysilicon layer overlying said first dielectric layer, said dielectric bars, and said T-shaped first polysilicon layer;

anisotropically etching back said second polysilicon layer to leave polysilicon pillars on either side of said dielectric bars and wherein said polysilicon pillars contact said T-shaped first polysilicon layer;

removing said dielectric bars whereby said T-shaped first polysilicon layer and said polysilicon pillars together form a storage node of said capacitor and wherein said polysilicon pillars have a spacing of as small as 100 to 1000 Angstroms;

depositing a capacitor dielectric layer over said first dielectric layer and said storage node;

depositing a third polysilicon layer overlying said capacitor dielectric layer wherein said third polysilicon layer forms the top electrode of said capacitor; and patterning said third polysilicon layer and said capacitor dielectric layer to complete formation of said DRAM with capacitor.

29. The method according to claim 28 wherein said second dielectric layer comprises a material that etches quickly and easily in hydrofluoric acid and has a thickness of between about 3000 and 12,000 Angstroms.

30. The method according to claim 28 wherein said photoresist mask has a thickness of between about 6000 and 10,000 Angstroms.

* * * * *